US010050037B2

(12) United States Patent
Cacho et al.

(10) Patent No.: US 10,050,037 B2
(45) Date of Patent: Aug. 14, 2018

(54) METHOD AND CIRCUIT FOR INTEGRATED CIRCUIT BODY BIASING

(71) Applicants: STMicroelectronics SA, Montrouge (FR); STMicroelectronics (Crolles 2) SAS, Crolles (FR)

(72) Inventors: Florian Cacho, Grenoble (FR); Vincent Huard, Le Versoud (FR)

(73) Assignees: STMICROELECTRONICS SA, Montrouge (FR); STMICROELECTRONICS (CROLLES 2) SAS, Crolles (FR)

( * ) Notice: Subject to any disclaimer, the term of this patent is extended or adjusted under 35 U.S.C. 154(b) by 0 days.

(21) Appl. No.: 15/609,571

(22) Filed: May 31, 2017

(65) Prior Publication Data

US 2018/0130803 A1    May 10, 2018

(30) Foreign Application Priority Data

Nov. 7, 2016    (FR) ...................................... 16 60745

(51) Int. Cl.
| | |
|---|---|
| *H03K 3/01* | (2006.01) |
| *H01L 27/092* | (2006.01) |
| *H03K 3/037* | (2006.01) |
| *H03K 19/21* | (2006.01) |
| *H01L 29/10* | (2006.01) |

(52) U.S. Cl.
CPC ...... *H01L 27/0928* (2013.01); *H01L 29/1083* (2013.01); *H03K 3/037* (2013.01); *H03K 19/21* (2013.01)

(58) Field of Classification Search
CPC ....... H03K 2217/0018; H03K 19/0016; H03K 19/00384; G05F 3/205; G11C 5/146

USPC .................................................. 327/534–535
See application file for complete search history.

(56) References Cited

U.S. PATENT DOCUMENTS

| | | | | |
|---|---|---|---|---|
| 6,501,313 | B2* | 12/2002 | Boerstler | ............. H03K 5/1565 327/175 |
| 6,847,252 | B1* | 1/2005 | Ono | ................. H03K 19/00384 327/537 |
| 9,417,657 | B2 | 8/2016 | Sharma et al. | |
| 2004/0016977 | A1* | 1/2004 | Miyazaki | ............ H01L 27/0928 257/393 |

FOREIGN PATENT DOCUMENTS

| | | |
|---|---|---|
| EP | 2 330 624 A1 | 6/2011 |
| FR | 3 017 466 A1 | 8/2015 |

OTHER PUBLICATIONS

Rebaud et al., "Timing slack monitoring under process and environmental variations: Application to a DSP performance optimization," *Microelectronics Journal* 42:718-732, 2011.

* cited by examiner

*Primary Examiner* — Quan Tra
(74) *Attorney, Agent, or Firm* — Seed IP Law Group LLP

(57) ABSTRACT

The disclosure concerns an integrated circuit comprising: a plurality of circuit domains, each circuit domain comprising: a plurality of transistor devices positioned over p-type and n-type wells, the transistor devices defining one or more data paths of the circuit domain; a monitoring circuit adapted to detect when the slack time of at least one of the data paths in the circuit domain falls below a threshold level and to generate an output signal on an output line based on said detection; and a biasing circuit adapted to modify a biasing voltage of the n-type and/or p-type well of the circuit domain.

20 Claims, 3 Drawing Sheets

METHOD AND CIRCUIT FOR INTEGRATED CIRCUIT BODY BIASING

BACKGROUND

Technical Field

The present disclosure relates to the field of integrated circuits, and in particular to a circuit and method for applying body biasing voltages to n-type and p-type wells of an integrated circuit.

Description of the Related Art

It has been proposed to alter a body biasing voltage of integrated circuits in order to increase performance and/or reduce power consumption. A shift towards SOI (silicon on insulator) based transistor technology makes body biasing a particularly interesting proposition as this technology permits relatively high biasing voltages, for example from as low as −3 V to as high as +3 V, to be applied to the body of the device. In particular, the biasing voltage is applied to the p-type or n-type well underlying each transistor device, sometimes referred to as the back gate. This compares to a more limited body biasing range of −300 mV to +300 mV in the case of bulk transistors.

For example, forward body biasing (FBB) involves applying a positive back biasing voltage and provides increased performance by increasing the speed of the transistors. Reverse body biasing (RBB) involves applying a negative back biasing voltage and provides reduced leakage currents and thus reduced power consumption.

Existing techniques for FBB and RBB have drawbacks in terms of complexity and/or lead to relatively poor power consumption for a given performance level.

BRIEF SUMMARY

It is an aim of embodiments of the present disclosure to at least partially address one or more needs in the prior art.

According to one aspect, there is provided an integrated circuit comprising: a plurality of circuit domains, each circuit domain comprising: a plurality of transistor devices positioned over p-type and n-type wells, the transistor devices defining one or more data paths of the circuit domain; a monitoring circuit adapted to detect when the slack time of at least one of the data paths in the circuit domain falls below a threshold level and to generate an output signal on an output line based on said detection; and a biasing circuit adapted to modify a biasing voltage of the n-type and/or p-type well of the circuit domain.

According to one embodiment, each circuit domain comprises a plurality of p-type wells electrically coupled together and a plurality of n-type wells electrically coupled together.

According to one embodiment, each circuit domain, the biasing circuit is coupled to the output line of the monitoring circuit and adapted to modify the biasing voltage based on said output signal.

According to one embodiment, the output lines of the monitoring circuits of the plurality of circuit domains are coupled to a control circuit, and the control circuit is adapted to control the biasing circuit of each circuit domain to modify the biasing voltages based on the output signals from each monitoring circuit.

According to one embodiment, the biasing circuit comprises a switch having a plurality of inputs coupled to corresponding supply voltage rails, and an output coupled via a well tap to the n-type or p-type well, the switch being controlled by said output signal to select one of the supply voltage rails to be coupled to the well tap.

According to one embodiment, the monitoring circuit comprises: a flip-flop having a data input coupled to the at least one data path and receiving a clock signal; and a circuit adapted to assert the output signal if a transition of a data signal in said at least one data path occurs within a first time period (d) of a clock edge of said clock signal.

According to one embodiment, the n-type and p-type wells extend across the plurality of circuit domains.

According to one embodiment, an insulating strip is positioned between one or more n-type wells of a first of the circuit domains and one or more n-type wells of a second of the circuit domains, and between one or more p-type wells of the first of the circuit domains and one or more p-type wells of the second of the circuit domains.

According to one embodiment, each circuit domain comprises a well of the first conductivity type enclosing a well of the second conductivity type.

According to a further aspect, there is provided a method comprising: detecting, by a monitoring circuit in each of a plurality of circuit domains of an integrated circuit, when a slack time of at least one data path in the circuit domain falls below a threshold level and generating an output signal on an output line based on said detection, wherein each circuit domain comprises a plurality of transistor devices positioned over p-type and n-type wells, the transistor devices defining one or more data paths of the circuit domain; and modifying, by a biasing circuit of each circuit domain, a biasing voltage of the n-type and/or p-type well of the circuit domain.

BRIEF DESCRIPTION OF THE DRAWINGS

The foregoing and other features and advantages will become apparent from the following detailed description of embodiments, given by way of illustration and not limitation with reference to the accompanying drawings, in which.

DETAILED DESCRIPTION

Throughout the following description, the term "connected" is used to designate a direct connection between circuit elements, whereas the term "coupled" is used to designate a connection that may be direct, or may be via one or more intermediate elements such as resistors, capacitors or transistors. The term "approximately" is used to designate a tolerance of plus or minus 10 percent of the value in question.

Figure 1:
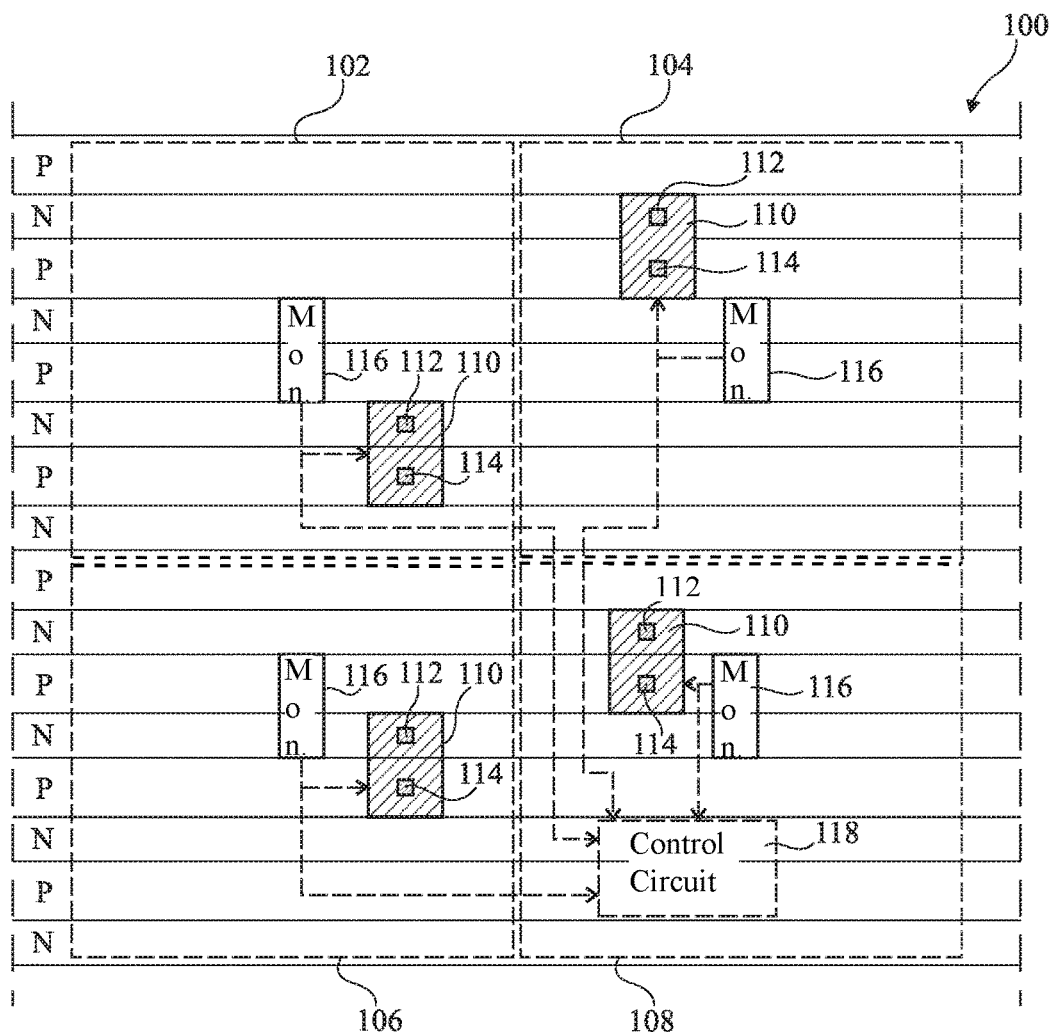
FIG. 1 is a plan view of part of an integrated circuit according to an example embodiment of the present disclosure.

FIG. 1 is a plan view of a portion of an integrated circuit 100 comprising circuit domains 102, 104, 106 and 108. While an example has been illustrated having four circuit domains arranged in a two-by-two block, in alternative embodiments there could be any plurality of circuit domains arranged in any manner.

The integrated circuit comprises transistor devices (not shown in FIG. 1) formed across the device, over corresponding p-type wells (PWELL) and n-type wells (NWELL). These wells are respectively labelled P and N in FIG. 1, and are for example in the form of rows across the integrated circuit that are alternatively of p and n type. For example, in one embodiment, the integrated circuit 100 has an SOI structure, the transistors being formed in a thin film of silicon separated from a silicon substrate by an insulating layer. The rows of p-type and n-type silicon forming the wells are formed within this silicon substrate.

Each circuit domain 102 to 108 comprises a biasing circuit 110 having a well tap 112 coupled to one of the NWELLs of the circuit and a further well tap 114 coupled to one of the PWELLs of the circuit domain. The biasing circuit 110 is for example adapted to modify a biasing voltage of the n-type and/or p-type well of the circuit domain.

Furthermore, each circuit domain 102 to 108 for example comprises a monitoring circuit 116 adapted to detect when the slack time of at least one of the data paths in the circuit domain falls below a threshold level. The biasing circuit 110 of each circuit domain is adapted to select a back biasing voltage to be applied to the PWELLs and NWELLs of the circuit domain based on the detection performed by the monitoring circuits 116.

Thus, during operation of the integrated circuit 100, the monitoring circuits 116 in each circuit domain 102 to 108 may detect when the slack time falls below a threshold level, for example due to an increase in the operating temperature of the device, an increase in the clock frequency, and/or a reduction in the supply voltage. In response, the corresponding biasing circuit 110 may modify the back biasing voltage of the affected circuit domains in order to increase the slack time.

For example, within each circuit domain 102 to 108, an output of the monitoring circuit 116 is coupled to the corresponding biasing circuit 110 in order to control the selection of the body biasing voltage. Thus each circuit domain has an autonomous circuit for modifying its back biasing voltages independently of the other circuit domains.

Alternatively, as represented by a dashed box in FIG. 1, a control circuit 118 may be provided, for example implemented in one of the circuit domains 102 to 108 or elsewhere in the integrated circuit. The control circuit 118 is coupled to the output lines of the monitoring circuit 116 of each circuit domain, and has outputs coupled to each of the biasing circuits 110 in order to control the biasing voltage to be applied. Thus a centralized approach is used for selecting the biasing voltage to be applied by each biasing circuit. This can for example be advantageous in order to avoid large voltage differences between the back biasing voltages applied to adjacent circuit domains, or in order to limit the overall power consumption of the integrated circuit by only allowing a certain number of circuit domains to be biased with relatively high voltages.

As described in more detail below, a circuit domain is a region of the circuit in which the biasing voltage of the PWELLs and NWELLs are controlled, at least to some extent, by a given biasing circuit. In some embodiments, the PWELLs of each circuit domain are electrically coupled together, such that they have a relatively uniform biasing voltage, and the NWELLs of each circuit domain are electrically coupled together, such that they have a relatively uniform biasing voltage. Furthermore, in some embodiments the NWELLs and PWELLs of each circuit domain may be electrically isolated from those of adjacent circuit domains, such that the biasing voltages applied to these PWELLs and NWELLs will have little or no influence on the PWELLs and NWELLs of adjacent circuit domains. Alternatively, the PWELLs and NWELLs may be continuous across several circuit domains, but the resistance of the wells means that there will be a voltage gradient between portions of the wells of adjacent circuit domains if different biasing voltages are applied to these domains.

Figure 2:
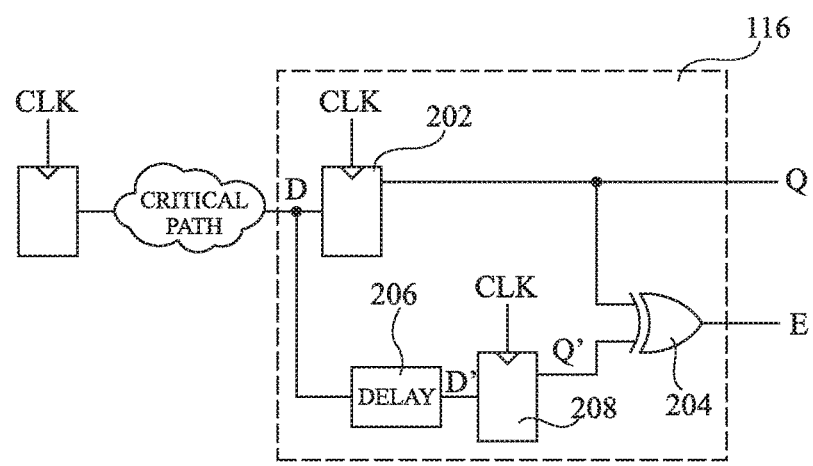
FIG. 2 schematically illustrates a monitoring circuit of the integrated circuit of FIG. 1 according to an example embodiment of the present disclosure.

FIG. 2 schematically illustrates an example of a monitoring circuit 116 of FIG. 1 in more detail according to an example embodiment.

The monitoring circuit 116 is for example coupled in a critical data path of the circuit domain. Indeed, critical paths are the first to have timing violations when the operating environment becomes more challenging, such as due to an increase in the clock frequency or a reduction in the supply voltage. For example, static timing analysis techniques can be used to determine the critical paths in the circuit design, so that monitoring circuits can be placed accordingly.

The monitoring circuit 116 for example comprises a flip-flop 202 forming part of the critical data path, which is for example a D-type flip-flop. The flip-flop 202 is clocked by a clock signal CLK. The output signal Q of the flip-flop 202 is for example coupled to one input of an XOR gate 204. The data line coupled to the input of the flip-flop 202 is also for example coupled, via a delay circuit 206, to a data input of a further shadow flip-flop 208, which is also for example a D-type flip-flop. The delay circuit 206 for example comprises a series connection of delay elements, such as buffers. The delayed signal at the output of the delay circuit 206 is labelled D'. The flip-flop 208 is clocked by the clock signal CLK, and generates an output signal Q', which is for example coupled to another input of the XOR gate 204.

The XOR gate 204 provides an early warning signal E that indicates when a slack time on the critical path has fallen below a threshold. This will be described now in more detail with reference to FIG. 3.

Figure 3:
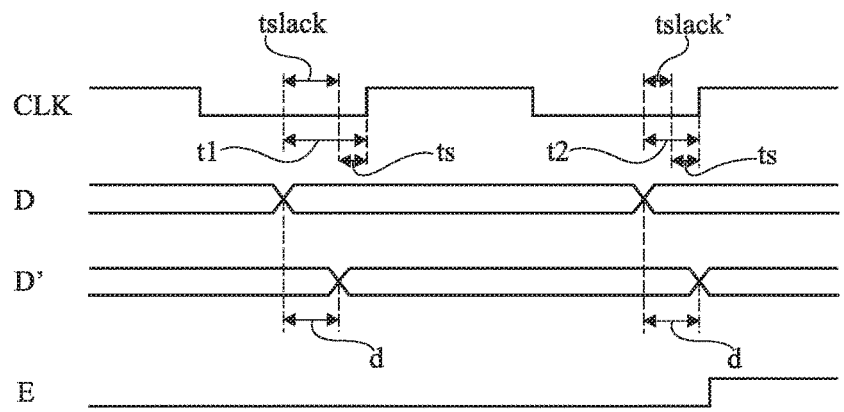
FIG. 3 is a timing diagram illustrating an example of signals in the circuit of FIG. 2 according to an example embodiment.

FIG. 3 is a timing diagram illustrating examples of the clock signal CLK, the data signals D and D' and the early warning signal E.

A first transition of the data signal D in the example of FIG. 3 occurs a time t1 before a rising edge of the clock signal CLK. Assuming that the flip-flop 202 has a setup time ts before the rising edge of the clock signal CLK, the slack time tslack is equal to t1−ts. If this slack time falls below zero, a timing violation will occur as the setup time of the flip-flop will no longer be respected, and the output data will become unstable. In the case of the first transition of FIG. 3, this slack time tslack has a greater duration than the delay d introduced by the delay circuit 206. Thus a first transition of the signal D' also respects the setup time ts of the flip-flop 208, which for example has the same setup time as the flip-flop 202. Thus when the data arrives with the slack time tslack, the signals Q and Q' will have the same value, and as a consequence, the output of the XOR gate 204 remains at "0", meaning that the signal E remains low and there is no early warning.

A second transition of the data signal D in the example of FIG. 3 occurs a time t2 before a subsequent rising edge of the clock signal CLK. The slack time tslack' is now equal to t2−ts, and has a shorter duration than the delay d introduced by the delay circuit 206. Thus the second transition of the signal D' does not respect the setup time ts of the flip-flop 208, and the output signal Q' of the flip-flop 208 does not transition. Thus the signals Q and Q' at the inputs of the XOR gate 204 are not equal, and the early warning signal E is asserted.

In one embodiment, whenever the early warning signal E is asserted by the monitoring circuit 116 of a circuit domain, the biasing circuit 110 of the circuit domain is controlled to increase the back biasing voltage applied to the NWELLs and PWELLs of the circuit domain.

Figure 4:
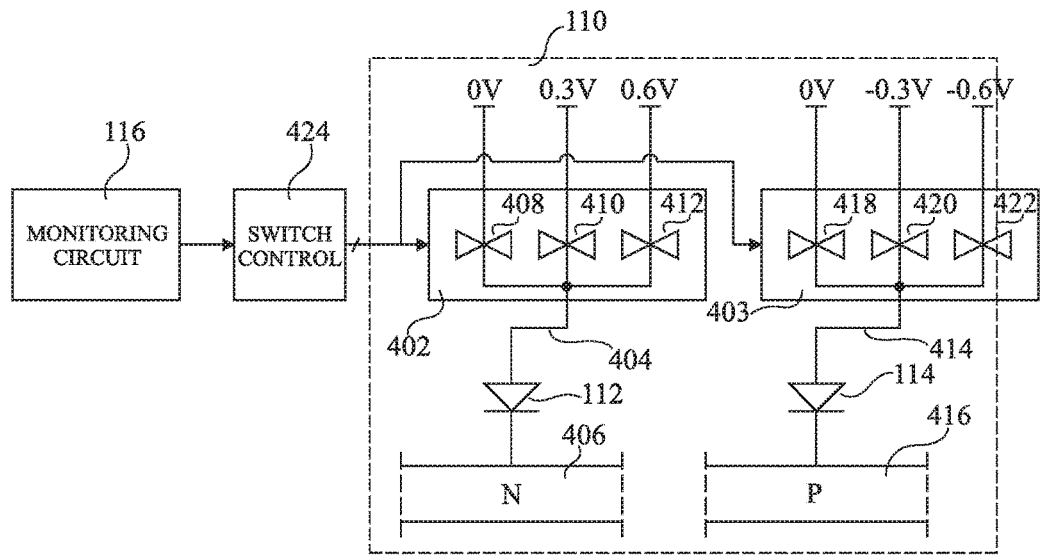
FIG. 4 schematically illustrates a biasing circuit according to an example embodiment of the present disclosure.

FIG. 4 schematically illustrates the biasing circuit 110 of one of the circuit domains according to an example embodiment.

The biasing circuit 110 for example comprises switching circuits 402 and 403 each coupled to a plurality n of supply voltage rails having different voltage levels.

In the case of regular threshold voltage (RVT) transistors, when no body biasing is applied, the PWELLs of NMOS transistors are for example biased at 0 V, and the NWELLs of PMOS transistors are for example biased at the supply voltage Vdd. Reverse body biasing (RBB) can be applied to such transistors, involving applying a body biasing voltage to the PWELLs of −Vrbb and/or a body biasing voltage to the NWELLs of Vdd+Vrbb', where Vrbb and Vrbb' may be different.

In the case of low threshold voltage (LVT) transistors (having flipped wells), when no body biasing is applied, the NWELLs of NMOS transistors and the PWELLs of the PMOS transistors are both for example biased at 0 V. Forward body biasing (RBB) can be applied to such transistors, involving applying a body biasing voltage to the NWELLs of +Vfbb and/or a body biasing voltage to the PWELLs of −Vfbb', where Vfbb and Vfbb' may be different.

FIG. 4 assumes a case in which the transistors to be back biased are LVT transistors.

In the example of FIG. 4, the switching circuit 402 is a three-path switch coupled to three supply rails, which are respectively at 0 V, 0.3 V and 0.6 V. The switching circuit 402 has an output 404 coupled to an NWELL 406 of the circuit domain via the well tap 112, which is for example implemented by a diode having its anode coupled to the output 404, and its cathode coupled to the NWELL. The switching circuit 402 for example comprises three switches 408, 410 and 412 respectively coupled between the corresponding supply voltage rails and the output 404. Of course, in alternative embodiments, additional voltage levels could be provided by further supply rails.

In the example of FIG. 4, the switching circuit 403 is a three-path switch coupled to three supply rails, which are respectively at 0 V, −0.3 V and −0.6 V. The switching circuit 403 has an output 414 coupled to a PWELL 416 of the circuit domain via the well tap 114, which is for example implemented by a diode having its anode coupled to the node 414, and its cathode coupled to the PWELL. The switching circuit 403 for example comprises three switches 418, 420 and 422 respectively coupled between the corresponding supply voltage rails and the output 414. Of course, in alternative embodiments, additional voltage levels could be provided by further supply rails.

As illustrated in FIG. 4, the switching circuits 402 and 403 are for example controlled by a switch control circuit 424, based on a control signal generated by the corresponding monitoring circuit 116, to couple one of the supply rails of switches 408 to 412 to the output 404 and one of the supply rails of switches 418 to 422 to the output 414. For example, each time the output signal of the monitoring circuit 116 is asserted, the switch control circuit 424 is configured to increase the biasing voltage Vfbb by controlling the switching circuit 402 to select a higher biasing voltage and the switching circuit 403 to select a lower (more negative) biasing voltage.

In alternative embodiments, the switching circuits 402 and 403 could be controlled directly by a control signal generated by the centralized control circuit 118 of FIG. 1. One skilled in the art will recognized that the centralized control circuit 118 or each switch control circuit 424 coupled be implemented by many different comparator circuits, logic gates, flip-flops, etc. in order to control the switches of each bias circuit.

The subdivision of the integrated circuit into circuit domains will now be described in more detail with reference to FIGS. 5A, 5B, 6A, 6B and 7.

Figure 5A:
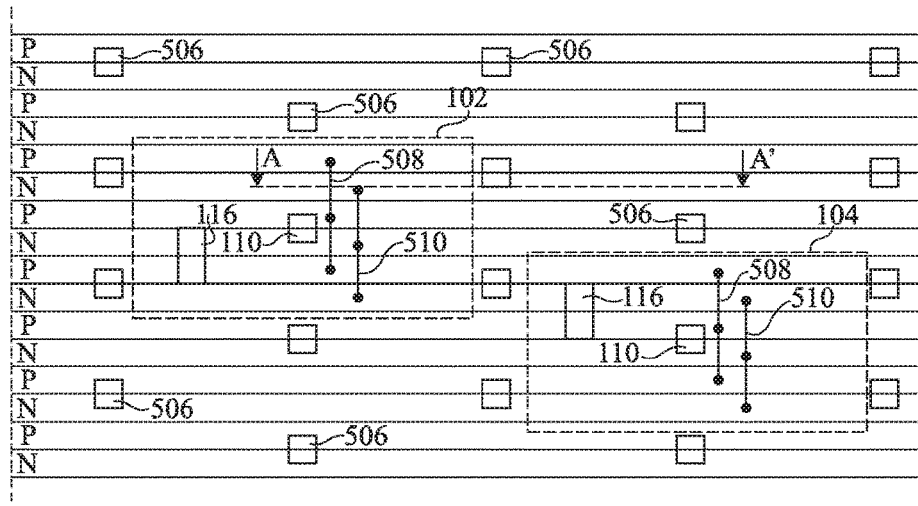
FIG. 5A is a plan view of a portion of an integrated circuit according to a further example embodiment.

FIG. 5A is a plan view of portion of an integrated circuit in which only the two circuit domains 102 and 104 are illustrated. In the example of FIG. 5A, the circuit domains 102, 104 are surrounded by circuit regions not associated with any circuit domain, and for example having biasing circuits 506 that apply static body biasing voltages to the corresponding PWELLs and NWELLs.

Each circuit domain 102, 104 for example comprises a monitoring circuit 116 and a biasing circuit 110 as described above. Furthermore, connections 508 are for example formed to electrically connect the PWELLs together within each circuit domain 102, 104, and connections 510 are for example formed to electrically connect the NWELLs together within each circuit domain 102, 104.

In the example of FIG. 5A, the NWELLs of the circuit domains 102, 104 extend into other regions of the integrated circuit, and similarly, the PWELLs of the circuit domains 102, 104 extend into other regions of the integrated circuit. However, the NWELLs and PWELLs will have a certain resistance, and thus the biasing circuit 110 within each circuit domain will modify the body biasing voltage within the circuit domain despite surrounding PWELLs and NWELLs being connected to static voltages. When a voltage difference is present between the biasing voltage applied to one circuit domain 102, 104 and the biasing voltage applied the other circuit domain 104, 102 or the static biasing voltage in the surrounding circuit regions, a voltage gradient will be present, as will now be described with reference to FIG. 5B.

Figure 5B:
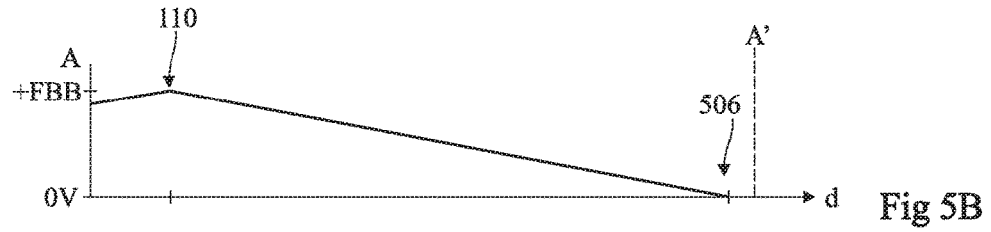
FIG. 5B is a graph illustrating voltage levels in a well of the circuit of FIG. 5A according to an example embodiment.

FIG. 5B is a graph illustrating the voltage level in an NWELL of FIG. 5A, and in particular the voltage along a portion A-A' of the NWELL passing close to a well tap of the biasing circuit 110 of the circuit domain 102 and a well tap of a further biasing circuit 506. As illustrated, in the case that the biasing circuit 110 of the domain 102 applies a forward body biasing voltage FBB, and the further biasing circuit 506 applies the ground voltage, there is for example a voltage gradient in the NWELL falling in a relatively linear fashion between FBB at the biasing circuit 110 to ground at the biasing circuit 506.

Figure 6A:
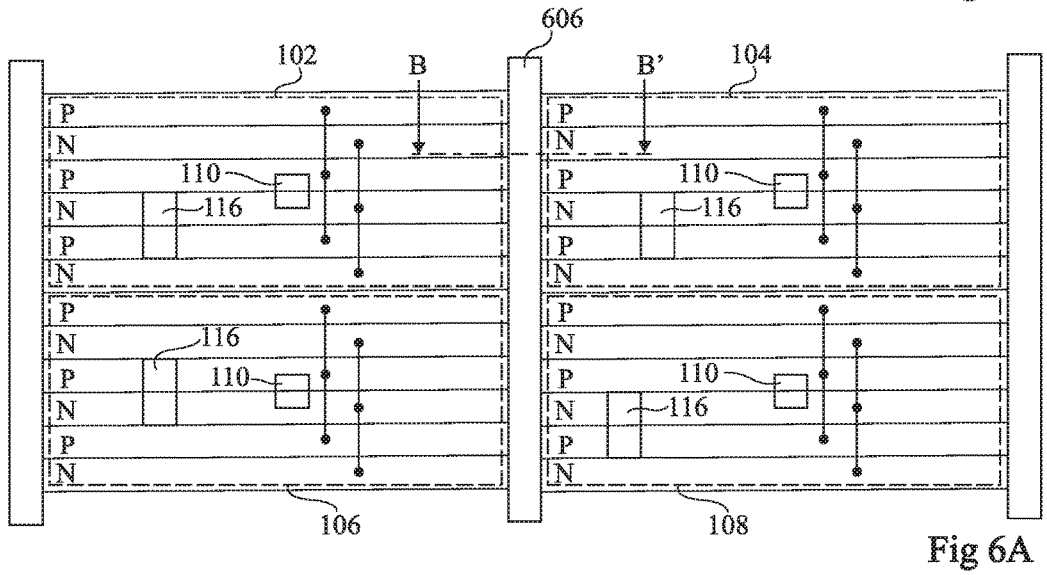
FIG. 6A is a plan view of a portion of an integrated circuit according to a further example embodiment of the present disclosure.

FIG. 6A is a plan view of a portion of an integrated circuit according to an alternative embodiment in which insulating strips are used to isolate the circuit domains. In this example the circuit domains 102 and 104 are separated by a substrate strip 606, which for example runs perpendicular to the lengths of the PWELLs and NWELLs of the circuit domains 102, 104. The NWELL and PWELL insulating strips are for example layer masks that may comprise "NWELL block" and "PWELL block" patterns so that the substrate strip 606 is not subjected to additional doping with respect to the levels in the substrate. The substrate being for example of the p-type, this strip 606 is thus also for example of the p-type. This strip 606 thus provides electrical isolation between the NWELLs of the circuit domains 102, 104, and introduces an additional resistance $R_{SUB}$ between the PWELLs of the circuit domains 102, 104. The substrate strip 606 for example extends to also provide a barrier between the circuit domains 106 and 108, and for example between other circuit domains not illustrated in FIG. 6A.

Figure 6B:
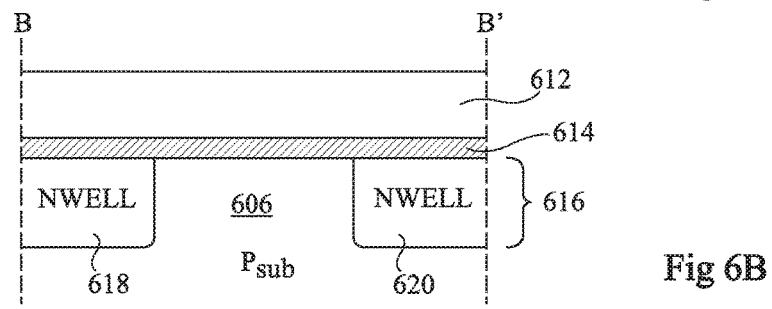
FIG. 6B is a cross-section view of part of the circuit of FIG. 6A according to an example embodiment.

FIG. 6B is a cross-section view of the structure of FIG. 6A taken along a portion B-B' of NWELLs of the circuit domains 102, 104 and passing through the substrate strip 606. As illustrated, the integrated circuit for example has an SOI structure comprising a layer of silicon 612 formed over a layer of insulator 614. The insulator layer 614 is formed over a silicon substrate 616 comprising an NWELL 618 forming part of the circuit domain 102, and an NWELL 620 forming part of the circuit domain 104. These NWELLs are separated by the substrate strip 606, which for example extends up to the insulator layer 614 and is continuous with the p-type substrate.

Figure 7:
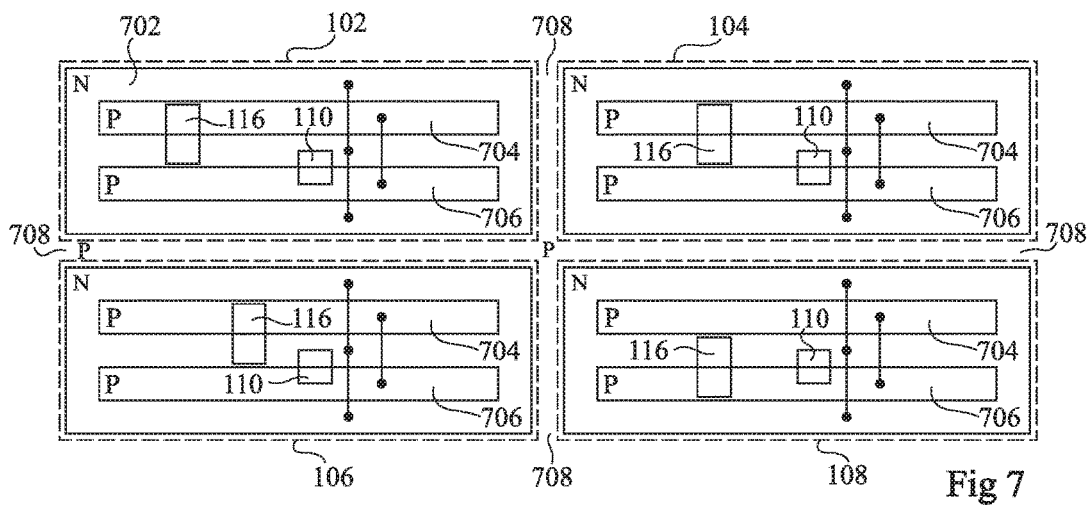
FIG. 7 is a plan view of a portion of an integrated circuit according to yet a further example embodiment.

FIG. 7 is a plan view of a portion of an integrated circuit according to yet a further example embodiment. In the example of FIG. 7, one of the wells 702 of each circuit domain 102, 104, 106, 108 encloses one or more further wells 704, 706 of the opposite conductivity type, and is surrounded by a well of the opposite conductivity type, in order to isolate the circuit domains from each other. In the example of FIG. 7, the wells 702 are NWELLs that enclose PWELLS 704, 706, and the NWELLS 702 of each circuit domain 102, 104, 106, 108 are separated from each other by a PWELL 708. Of course, in alternative embodiments, each of the circuit domains could comprise a PWELL enclosing one or more NWELLs, and an NWELL could separate these PWELLs of adjacent circuit domains.

An advantage of the embodiments described herein is that body biasing may be applied to different circuit domains of an integrated circuit as a function of the particular constraints in that circuit domain. This permits a local improvement of performance to be applied, and a reduction in power consumption in other portions of the integrated circuit having less critical paths.

Having thus described at least one illustrative embodiment, various alterations, modifications and improvements will readily occur to those skilled in the art. For example, it will be apparent to those skilled in the art that the embodiments described in relation to FIGS. 5A, 5B, 6A, 6B and 7 for subdividing an integrated circuit into circuit domains are merely some examples, and that other techniques could be used.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An integrated circuit comprising:
a plurality of circuit domains, each circuit domain including:
p-type and n-type wells;
a plurality of transistor devices positioned over the p-type and n-type wells, the transistor devices defining one or more data paths of the circuit domain;
a monitoring circuit that, in operation, detects when a slack time of at least one of the data paths in the circuit domain falls below a threshold level, and generates an output signal on an output line based on said detection; and
a biasing circuit that, in operation, modifies a biasing voltage of at least one of the n-type or p-type well of the circuit domain.

2. The integrated circuit of claim 1, wherein the p-type and n-type wells in each circuit domain comprise a plurality of p-type wells electrically coupled together and a plurality of n-type wells electrically coupled together.

3. The integrated circuit of claim 1, wherein, within each circuit domain, the biasing circuit is coupled to the output line of the monitoring circuit and modifies the biasing voltage based on said output signal.

4. The integrated circuit of claim 1, further comprising a control circuit coupled to the output lines of the monitoring circuits of the plurality of circuit domains, wherein the control circuit is configured to control the biasing circuit of each circuit domain to modify the biasing voltages based on the output signals from each monitoring circuit.

5. The integrated circuit of claim 1, wherein, within each circuit domain, the biasing circuit comprises:
a well tap coupled to one of the n-type or p-type wells; and
a switch having a plurality of inputs coupled to corresponding supply voltage rails, and an output coupled via the well tap to the one of the n-type or p-type wells, the switch being controlled, in operation, by said output signal to select one of the supply voltage rails to be coupled to the well tap.

6. The integrated circuit of claim 1, wherein the monitoring circuit comprises:
a flip-flop having a data input coupled to the at least one data path and a clock input configured to receive a clock signal; and
a logic circuit that asserts the output signal if a transition of a data signal in said at least one data path occurs within a first time period of a clock edge of said clock signal.

7. The integrated circuit of claim 1, wherein said n-type and p-type wells extend across the plurality of circuit domains.

8. The integrated circuit of claim 1, further comprising an insulating strip positioned between one or more n-type wells of a first of said circuit domains and one or more n-type wells of a second of said circuit domains, and between one or more p-type wells of the first of said circuit domains and one or more p-type wells of the second of said circuit domains.

9. The integrated circuit of claim 1, wherein each circuit domain comprises at least one of:
a p-type well enclosing an n-type well, or
an n-type well enclosing a p-type well.

10. A method comprising:
in each circuit domain of a plurality of circuit domains of an integrated circuit that include a plurality of monitoring circuits, respective, and a plurality of biasing circuits, respectively, detecting, by the monitoring circuit in the circuit domain, when a slack time of at least one data path in the circuit domain falls below a threshold level and generating an output signal on an output line based on said detecting, wherein each circuit domain comprises a plurality of transistor devices positioned over p-type and n-type wells, the transistor devices defining one or more data paths of the circuit domain; and in each circuit domain, modifying, by the biasing circuit of the circuit domain, a biasing voltage of at least one of the n-type wells or p-type wells of the circuit domain.

11. The method of claim 10, wherein the p-type and n-type wells in each circuit domain comprise a plurality of p-type wells electrically coupled together and a plurality of n-type wells electrically coupled together.

12. The method of claim 10, wherein, within each circuit domain, the biasing circuit modifies the biasing voltage based on said output signal.

13. The method of claim 10, further comprising controlling, using a control circuit coupled to the output lines of the monitoring circuits of the plurality of circuit domains, the biasing circuit of each circuit domain to modify the biasing voltages based on the output signals from each monitoring circuit.

14. The method of claim 10, wherein, within each circuit domain, the biasing circuit comprises a well tap coupled to one of the n-type or p-type wells; and a switch having a plurality of inputs coupled to corresponding supply voltage rails, and an output coupled via the well tap to the one of the n-type or p-type wells, the method further comprising controlling the switch, by said output signal to select one of the supply voltage rails to be coupled to the well tap.

15. The method of claim 10, wherein the monitoring comprises:

asserting the output signal if a transition of a data signal in the at least one data path occurs within a first time period of a clock edge of a clock signal provided to a flip-flop having a data input coupled to the at least one data path.

16. An integrated circuit comprising:
a plurality of circuit domains, each circuit domain including:
p-type and n-type wells;
one or more data paths positioned over the p-type and n-type wells;
a monitoring circuit that, in operation, detects when a slack time of at least one of the data paths in the circuit domain falls below a threshold level, and generates an output signal on an output line based on said detection; and
a biasing circuit that, in operation, modifies a biasing voltage of at least one of the n-type or p-type well of the circuit domain based on said output signal.

17. The integrated circuit of claim 16, wherein the p-type and n-type wells in each circuit domain comprise a plurality of p-type wells electrically coupled together and a plurality of n-type wells electrically coupled together.

18. The integrated circuit of claim 16, further comprising a control circuit coupled to the output lines of the monitoring circuits of the plurality of circuit domains, wherein the control circuit is configured to control the biasing circuit of each circuit domain to modify the biasing voltages based on the output signals from each monitoring circuit.

19. The integrated circuit of claim 16, further comprising a plurality of control circuits positioned in the circuit domains, respectively, wherein for each circuit domain, the control circuit is coupled to the output line of the monitoring circuit of the circuit domain, and is configured to control the biasing circuit of the circuit domain to modify the biasing voltage based on the output signal from the monitoring circuit of the circuit domain.

20. The integrated circuit of claim 16, wherein, within each circuit domain, the biasing circuit comprises:

a well tap coupled to one of the n-type or p-type wells; and
a switch having a plurality of inputs coupled to corresponding supply voltage rails, and an output coupled via the well tap to the one of the n-type or p-type wells, the switch being controlled, in operation, by said output signal to select one of the supply voltage rails to be coupled to the well tap.

* * * * *